(12) United States Patent
Dempsey (10) Patent No.: US 9,948,315 B2
(45) Date of Patent: Apr. 17, 2018

(54) DIGITAL TO ANALOG CONVERTER INCLUDING LOGICAL ASSISTANCE

(71) Applicant: Analog Devices Global, Hamilton (BM)

(72) Inventor: Dennis A. Dempsey, Newport (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/618,392

(22) Filed: Jun. 9, 2017

(65) Prior Publication Data

US 2017/0359079 A1 Dec. 14, 2017

Related U.S. Application Data (60) Provisional application No. 62/348,746, filed on Jun. 10, 2016.

(51) Int. Cl.
*H03M 1/10* (2006.01)

(52) U.S. Cl.
CPC ................................. *H03M 1/1009* (2013.01)

(58) Field of Classification Search
CPC ......... H03M 1/1009; H03M 1/66; H03M 1/70
USPC ................. 341/118, 120, 139, 142, 144, 145
See application file for complete search history.

(56) References Cited

U.S. PATENT DOCUMENTS

| | | | |
|---|---|---|---|
| 6,066,986 A | 5/2000 | Chao | |
| 6,081,751 A | 5/2000 | Luo et al. | |
| 6,181,263 B1 | 1/2001 | Malik et al. | |
| 7,355,536 B2 * | 4/2008 | Dempsey | H03M 1/1038 341/120 |
| 7,450,044 B2 * | 11/2008 | Moore | H03M 1/0609 341/118 |
| 8,063,805 B1 | 11/2011 | Eid | |
| 8,456,338 B2 | 6/2013 | Regier et al. | |
| 8,604,765 B2 | 12/2013 | Regier et al. | |
| 8,884,573 B2 | 11/2014 | Lyden et al. | |
| 9,330,734 B2 | 5/2016 | Mozak et al. | |
| 9,407,278 B1 | 8/2016 | Dempsey | |
| 2005/0285674 A1 | 12/2005 | Zaguri | |
| 2008/0278200 A1 | 11/2008 | Chiu et al. | |
| 2009/0302922 A1 | 12/2009 | Kibune | |
| 2014/0292249 A1 | 10/2014 | Lyden et al. | |

(Continued)

OTHER PUBLICATIONS

Amir Zjajo et al. *A Low-Power Digitally-Programmable Variable Gain Amplifier in 65 nm CMOS*, Conference Paper, Jan. 2010, 7 pages.

(Continued)

*Primary Examiner* — Khai M Nguyen
(74) *Attorney, Agent, or Firm* — Patent Capital Group (57) ABSTRACT

Digital to analog converters (DAC) are used to convert digital signals to analog values. The digital system providing data to the analog converter may be highly tasked. A DAC is provided with some in built logic to assist in reducing the load on the devices driving the DAC. The DAC may include a library of functions that it can apply to the input words to modify transitions in the analog output words. The DAC may further include a health checking system for monitoring the digital words being supplied to the DAC and raising a concern, and taking action if required, if the sequence of words is unlikely to be correct or beyond the target operating range.

20 Claims, 6 Drawing Sheets

(56) References Cited

U.S. PATENT DOCUMENTS

2015/0061769 A1 3/2015 Bodnar et al.
2017/0359077 A1 12/2017 Dempsey et al.

OTHER PUBLICATIONS

M. Degrauwe et al., *A Microwave CMOS-Instrumentation Amplifier*, IEEE Journal of Solid-State Circuits, vol. SC-20, No. 3, Jun. 1985, 3 pages.
Non-Final Office Action issued in U.S. Appl. No. 15/618,620 dated Nov. 16, 2017, 11 pages.

* cited by examiner

DIGITAL TO ANALOG CONVERTER INCLUDING LOGICAL ASSISTANCE

PRIORITY DATA AND RELATED APPLICATIONS

This Non-Provisional Patent Application claims priority to and/or receives benefit from U.S. Provisional Patent Application having Ser. No. 62/348,746 filed on Jun. 10, 2016 entitled "DIGITAL TO ANALOG CONVERTER INCLUDING LOGICAL ASSISTANCE", which is hereby incorporated by reference in its entirety. A related U.S. Provisional Patent Application having Ser. No. 62/351,393 filed on Jun. 17, 2016 entitled "BUFFER AND DIGITAL TO ANALOG CONVERTER IN COMBINATION WITH A BUFFER", is also hereby incorporated by reference in its entirety.

TECHNICAL FIELD OF THE DISCLOSURE

The present disclosure relates to a digital to analog converter, where the digital to analog converter includes logical assistance, for example in the form of a transition controller and/or an input signal monitoring system.

BACKGROUND

Digital to analog converters (DACs) find utility in a great many devices. They can be found in audio and video systems, and within motor control and industrial control systems. Automotive, aerospace, instrumentation and sensor actuation and healthcare sectors are also users of large numbers of DACs.

Motor control systems can range from the very large where, for example, massive machines such as cranes and lifting gear are controlled by signals output by a DAC, to the very small where, for example, autofocus functions in cameras or other small scale actuators or micro-machines are controlled by a DAC.

Sometimes the processing systems providing input words to the digital to analog converter are themselves relatively modest in their capability or are highly tasked such that they do not have the spare capacity to reliable take on updating the DAC at a higher rate. It would therefore be advantageous to include some form of flexibility within (i.e. as part of) the DAC which enabled its output, and in particular the shape of transitions at the output of the DAC to be controlled without requiring further intervention by the system providing input words to the DAC.

BRIEF SUMMARY OF THE DISCLOSURE

According to a first aspect of this disclosure there is provided a DAC comprising a transition controller. The DAC is operable to output an analog value in response to a control word. The analog value may be a voltage or a current, or it may be setting a resistance (for example in a digiPOT available from Analog Devices), or a capacitance or the value of a timing or phase delay. When the DAC is instructed to change its output value, for example from a first value corresponding to a first control word to a second value corresponding to a second control word the transition controller inserts at least one intermediate step in the transition.

Advantageously, the transition controller inserts a plurality of steps and the shape of the transition is selectable from the predefined library held in a memory within a DAC. The transition controller may be responsive to a control signal to control the start of the transition that it introduces. The control signal may be provided solely to the DAC or it may be shared amongst several DACs so as to synchronize them.

The transition controller is preferably provided as a relatively small collection of gates associated with the DAC. Typically the transition controller comprises a multiplier, a few summers or accumulators and a memory containing one or more transition definitions.

Typically, a DAC has a digital front end. This is so that a word to be converted can be latched, or registered, by the DAC. This is done so that the bus driving the DAC can then be used to address other devices. DACs may have several sets of latches such that new words can be preloaded while the DAC is acting to output an already defined value. This can be useful where it is desired to synchronize updates across a set of DACs.

The transition controller can be included within the digital front end of a DAC, within the digital signal chain.

Thus the transition controller is not analogous to a digital signal processor (DSP) provided in a system on chip or system in a package with a DAC. DSPs are often very powerful and resource hungry devices.

Some DACs are known which include interpolation by daisy chaining multiple finite impulse response (FIR) filters. The purpose of interpolation is to increase the data (refresh) rate at the output of the DAC. This increases the Nyquist frequency but not the bandwidth of the output signal and consequently make the design of the anti-aliasing filter following the DAC much easier. An example of an interpolating DAC is the DAC5688 from Texas Instruments. This comprises a daisy chain of three FIR filters. The first filter has 67 taps, the second filter has 19 taps and the third filter has 11 taps. Thus one DAC channel includes at least 97 16 bit registers, plus associated multipliers and summers to implement the FIR filters. Furthermore the incoming data stream needs to be modified, for example by "zero stuffing" prior to providing the signal to the FIR filters.

By way of contrast, the transition controller can apply one or more transitions from a library where the shape of the transition does not conform to "interpolation" in the conventional form, because it does not seek to follow the shape or trajectory of the input waveform. The controller can be considered as being non-linear. It can also be considered as being time variant because its response changes during the course of the transition between the first and second values.

The transition controller may include or be implemented as a digitally controllable control loop. The transition controller may be operable to receive a feedback signal. The feedback signal could be a sampled version of the output of the DAC. The transition controller may then act on the feedback signal to form a closed or open control loop. The control loop may implement first, second or higher order functions. Such functions can include differencing, summing and multiplying functions (being analogous to the classical analog functions of proportionality, integration and differentiation).

According to a second aspect of the present disclosure there is provided a method of modifying an output response of a DAC in response to instructions to modify an output value from a first output value corresponding to a first input word to a second output value corresponding to a second input word. A transition controller is provided as part of a digital front end of the DAC and instructs an analog back end of the DAC to output at least one intermediate step in an output sequence from the DAC. The transition controller may also include some rules for health checking the instructions being sent to the DAC.

According to a further aspect of this disclosure there is provided a DAC with an embedded input word checking engine, where the checking engine is arranged to monitor the evolution of the input words applied to the DAC, and to output a message or an alert if the sequence does not conform with one or more rules or if the sequence deviates in a statistically significant way from long term or short term historic trends. The degree of statistical significance that triggers a message may be preset or may be user adjustable. Additionally the DAC may be responsive to status signals or words provided by other systems or the controller in order to provide context about the current operating conditions, status or mode, which may be used to modify the checking that the DAC performs.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
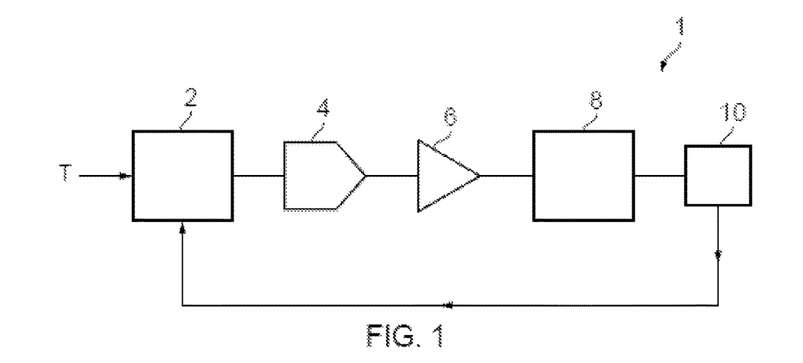
FIG. 1 is a schematic diagram of a control system for an actuator, the control system including a DAC.

FIG. 1 schematically illustrates a part of a complex system which includes a control loop, generally indicated 1, which for the purposes of providing a context with which to consider a control loop's operation, can be used to control the position of an actuator. The control loop 1 receives a target signal T from a further system, such as a digital controller, which is not illustrated. The target T is provided to a first input of a controller 2 which implements one or more control schemes. The control schemes may include "classical" control schemes such as a proportional control scheme, a differential control scheme, an integral control scheme, a two term or three term controller such a proportional-integral-derivative (PID) controller, or it may implement a fuzzy logic based control scheme, expert system control schemes, adaptive control schemes or other controls schemes not mentioned and a combination of control schemes. The control scheme may include filtering means without digital feedback, e.g. FIR filter, or with digital feedback, e.g. infinite impulse response (IIR) filter. Furthermore the controller may transition between control schemes based on input information or monitoring of a feedback signal. Nevertheless, irrespective of what the control scheme or schemes the system designer has chosen to enact, the controller outputs a control word representing an output of its calculation. The controller output word is provided to a digital input of a DAC 4. The DAC 4 converts the digital control word into an analog variable and the analog variable, such as a voltage, is then provided to an optional output buffer 6 in order to amplify and/or offset the variable or provide a load driving capability beyond that of the DAC. The buffer may be connected to an actuator 8 which represents a device whose position is to be controlled. The position of the actuator is sensed by a sensor 10 which provides a feedback signal to a feedback input of the controller 2. The sensor 10 could be part of the actuator itself, and, for example, the coil of a motor may also act as the sensor by virtue of back electromotive force (EMF) generated within the coil.

The digital to analog converter 4 may be implemented by any suitable technology, such as resistor string DACs where connections to nodes in a resistor string are controlled by field effect transistors operating as switched. However it should be noted that the choice of technology is not important for the purposes of this disclosure.

The actuator 8 may be a physically large machine or a physically small one. For example voice coil motors are now routinely provided as actuators in lens positioning systems for autofocus functionality within smartphones and cameras. Such voice coil motors represent examples of physically small actuators. However other loads to which the buffer may be connected could be electrochemical cells and the feedback signal may be representative of current flow in the cell.

A voice coil motor system represents a good example to consider further because the user of the smartphone will not accept a long delay while the autofocus system sets up the focusing correctly. As a result, there is a desire for the voice coil motor and lens assembly to be responsive and to move rapidly. Providing a rapid response for a mechanical system, for example in the form of a relatively large mass and having a long time constant (compared to that of an electronic system) is generally at odds with providing a non-resonant response. Put another way, for a mechanical system to be instructed to be moved rapidly from an initial position at which the system is at rest (not moving) to a new position it generally has to be less than critically damped. For a system not to resonate it has to be more than critically damped but this means that the response time to move the actuator from a first position to a second position is significantly increased in a critically damped system or in an over damped system.

Figure 2:
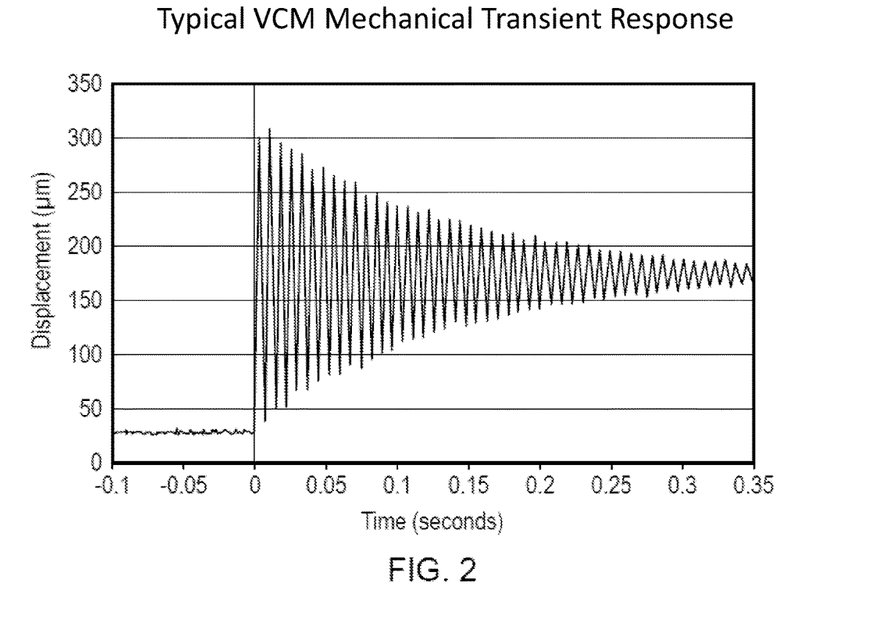
FIG. 2 schematically illustrates the response of an under damped voice coil motor in response to a step change in the demand position for the motor.

FIG. 2 schematically illustrates the response of the voice coil motor to an instruction to change its displacement from a value corresponding to approximately 25 microns from a reference position to approximately 175 microns from its reference position. The position change is instructed as a step change, as is the generally adopted practice, to the voltage applied to the motor coil of a motor with step change occurring at time T=0 in FIG. 2. It can be seen that the motor exhibits a significant amount of overshoot and ringing and that this ringing decays away slowly if steps are not taken to address it.

In some systems, a control technique for a voice coil motor within a camera system can involve to address the issues of resonance of the mechanical system. In those systems, the resonant frequency of the voice coil motor needs to be known, and then the update from the initial value to the final value can be broken into a series of intermediate steps with each change being applied after a time T0 corresponding to the inverse of the resonant frequency. The transition between each one of the intermediate values could be smoothed out by a smoothing circuit but each of the intermediate values has to be provided by a controller. The steps can correspond to a selected row from Pascal's triangle. Thus the task of adapting the drive waveform to deal with artefacts of the driven system fell to the controller to generate an appropriate sequence of target values.

In accordance with the teachings of the present disclosure the task of generating intermediate values is removed from the system providing the target value, and is brought on board the DAC. An update engine 20 is provided as part of, and preferably embedded in, the digital to analog controller. The update engine 20 can form part of the digital front end of the DAC. The update engine, which can also be regarded as a transition controller can be provided as a state machine having reference to a library of one or more predefined update sequences or user configurable options. This simplifies the computational requirements for computer systems and the like providing target values to the controlled system and also means that some level of autonomy, power control or performance checking may be embedded within the digital to analog controller to enable it to provide improved performance or improves safety/robustness. This controller may therefore provide sub-sampling, or compressive sampling, DAC system capability. The transition controller can implement a sequence of step sizes that do not vary monotonically and which are more than just an interpolation of the input sequence.

Figure 3:
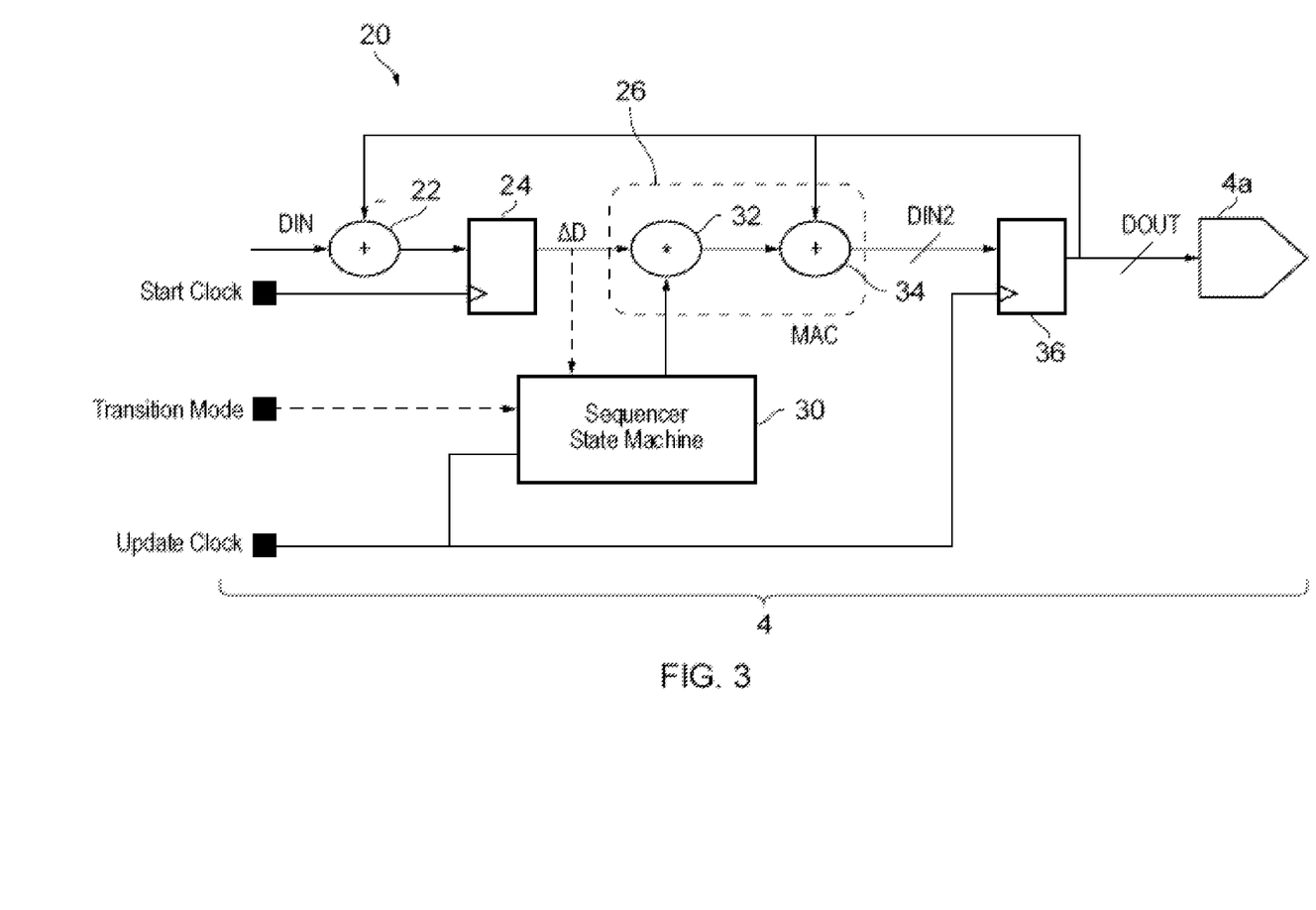
FIG. 3 is a circuit diagram of a transition controller and DAC in accordance with a first embodiment of the present disclosure.

FIG. 3 is a schematic diagram of a DAC 4 including a transition controller provided in combination with a DAC back end 4a which actually generates the analog signal to be output. As shown in FIG. 3 the transition controller, generally designated 20, comprises a digital subtractor 22 for forming a difference between a new target value "DIN" and the preceding digital value "DOUT" (corresponding to a preceding value of DIN, i.e. DIN_OLD) provided to the DAC 4. The digital subtractor 22 forms a word representing the difference between DIN and DOUT (i.e. between DIN and DIN_OLD) and this is latched into a register 24. Consequently the register provides a value "ΔD" representative of the size and direction of the transition that needs to be processed. The value ΔD could be held unchanged from one DAC update to another, i.e. from one value of DIN to another value to DIN. The value ΔD is provided to a first input of an arithmetic unit 26 which is operable to perform multiply and accumulate instructions. The arithmetic unit 26 may also include a register (not shown) to record the value of DOUT prior to the update sequence being performed and to store that value.

The update engine also includes a state machine 30 which controls the shape of the transition in response to a transition mode input signal. Effectively the state machine 30 includes one or more maps or libraries of normalized functions, where the values range between 0 and 100% of the DAC resolution (e.g. between 0 and 255 for an 8 bit DAC, between 0 and 4095 for a 12 bit DAC and so on) as a function of time, which are successively applied to the value ΔD by way of a multiplier 32 and then sequentially added to the value DOUT as stored in the previous (output) register 36 by a summer (or adder) 34. Thus a sequence of intermediate words describing the transition between DOUT and new DIN can be output as DIN2 and successively clocked into a further (output) register 36 and then provided to the DAC back end 4a to generate the modified transition in voltage between old DOUT and a new DOUT. The update clock runs at a higher rate that the DIN update rate. In this example the library of normalized function contains the change from one intermediate value to the next and so on until the final value is reached.

Figure 4:
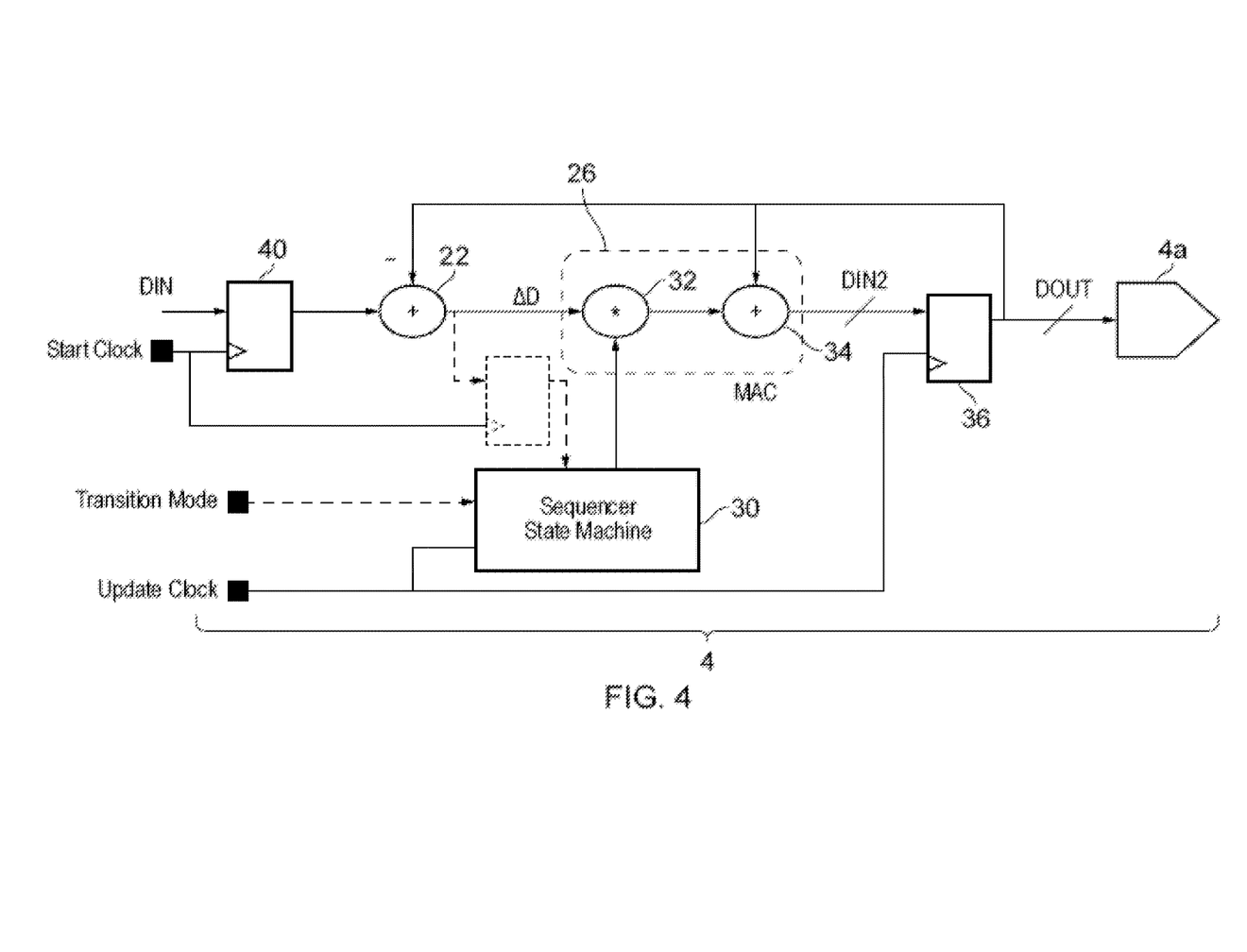
FIG. 4 is a circuit diagram of a second embodiment of the present disclosure.

FIG. 4 shows an alternative embodiment where the update sequence acts in a closed loop manner and consequently the new value DIN is recorded by a register 40 placed upstream of the digital subtractor 22, and the register 24 of FIG. 3 can be dispensed with.

The state machine (sequencer) 30 may be arranged to provide the clock to the (output) register 36 thereby giving the state machine (sequencer) 30 control over the update rate at the (output) register 36. That said, a similar effect could be obtained by holding the multiplication coefficient provided to the multiplier 32 static for several cycles of the update clock prior to changing it. The multiplication coefficient can be set to zero to stop summer (or adder) 34 modifying the output word at each DAC update clock transition.

The update sequencer of the state machine 30 may have access to a predetermined library of update profiles. These may also be delivered over a communications link, which may include a specific sequence of input words to the DAC to cause it to modify its operation such that in interprets the words as digital programming instructions and not as words to be converted to an analog value. The delivery of the specific sequence of values may be preceded by a specific event, such as a reset signal, for the programming and/or update mode to be entered. For the purposes of transition frequency content spreading the DAC update sequencer or the DAC itself may also include a pseudorandom generator which is able to add a pseudorandom variation to the predetermined update sequences so as to modify the amount of noise or possibly shape the amount of noise in the DAC output, or vary the spectral content of the signal output by the DAC 4.

Figure 5A:
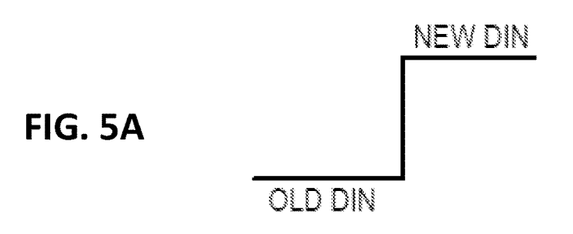
FIGS. 5A-D show an initial step transition resulting from a code change supplied to the DAC, and variations of the transition applied as a result of the transition controller embedded within the DAC chip.
Figure 5B:
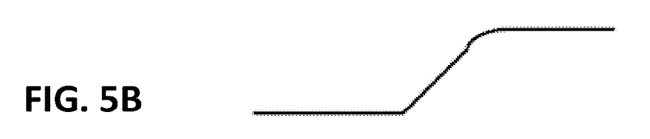
Figure 5C:
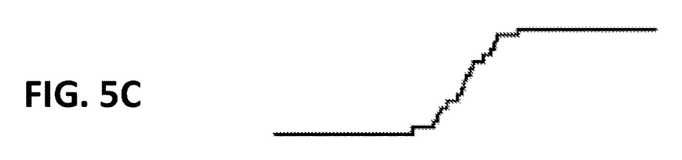

FIGS. 5A-5D show exemplary, but not limiting, modifications which may be applied to a step change signal which is expected to transition from a first value, corresponding to old DIN to a new value, corresponding to new DIN. As shown in FIG. 5B a first modification might be to spread the transition out over a predetermined number of steps and over a predetermined time in a linear manner, thereby creating a ramp like approximation to the transition. As shown in FIG. 5C the transition might include a combination of ramp portions and plateau or pseudo-static portions. This effectively provides a way of replicating the drive signals of some systems but without having to burden the system providing the target value T from having to calculate those values.

Figure 5D:
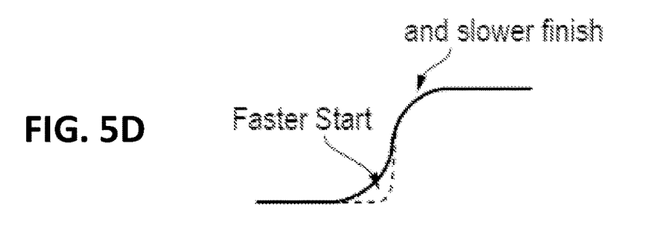

A further option, as shown in FIG. 5D, is to smooth either the start or end portions, or both, of the transition thereby giving it an "S" like shape again in order to modify the frequency content of the transition. It may be preferred for higher frequency content to be in the earlier part of transition and lower frequency content to be toward the end of the transition.

It can thus be seen that the provision of a transition sequencer 20 as part of the DAC can provide enhanced flexibility without burdening the control system driving the DAC. Furthermore, in some variations the transition sequence may be described in a parameterized form for example as a second order differential equation describing a mechanical resonance system and parameters describing the resonant system may be loaded into the transition sequencer such that it can adapt the step size and update rate to control (for example by monitoring the perturbations in the voltage or current at the output of the buffer by way of an embedded analog to digital converter), and preferably minimize resonant behavior in the driven system thereby reducing the computational task required of the controller 2 thereby providing a further simplification of systems controlling the DAC. It is thus possible to provide a transition of a few to tens of intermediate steps with a minimal additional hardware overhead.

Figure 6:
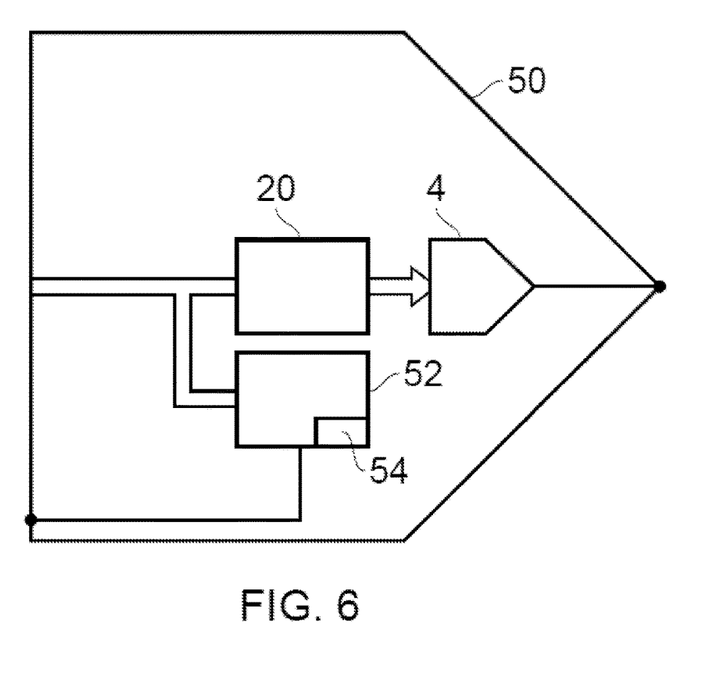
FIG. 6 schematically illustrates a DAC constituting a further embodiment of this disclosure.

As shown in FIG. 6, DAC 50 may further include a health check function 52 as well as the update engine 20. This enables higher level checking functions to be implemented within the DAC. The update engine 20 can be used to tune the dynamics of the controlled system, for example by modifying a transition to reduce ringing in a controlled system. However this does not prevent a system error, such as a failed sensor or a fault in a data processor or an error in a program being executed on the data processor, from providing instructions which may be wrong or at least suspect. For example, in the autofocus camera example, it is highly unlikely that a properly functioning system would seek to move the lens by large displacements over a prolonged period of time. Consequently a simple rule looking for a sequence of changes greater than a predetermined magnitude for a predetermined period of time may be indicative of a fault being diagnosed. Such a sequence could be detected by summing a magnitude of word changes, for example by summing the magnitude of ΔD over a predetermined period, as may be set by a register value, and setting an error flag if a threshold is exceeded.

Similarly, if a value remains static for longer than expected or desirable an error message may be sent to the control system.

If a response to an error message is not received, thereby providing confidence that a control system providing input words to the DAC is still operating correctly, then the DAC may be programmed with authority to implement a remedial action. This may, for example, include driving the output to a predetermined value set by the system designer as a default. Alternatively the DAC may include an embedded processor or configurable logic unit (be that by software or register settings) in association with or as part of the health check system that enables the DAC to implement a back-up control strategy and possibly seek data from another source. This may be possible if, for example, the DAC has access to a bus, such as a serial data bus, from where it could monitor data messages that had been destined for the controller that drives the DAC. The DAC may be enabled to perform remedial action without having sent an error message.

More complex signal analysis may also be performed. A signal analysis section may be provided in combination with the state machine, as shown in FIG. 6, which may execute a program to learn the nature of the signals being used to drive the DAC. Such analysis may include statistical analysis checking for frequency and magnitude checking. Thus unexpectedly large or small runs of signal magnitude may be flagged as being statistically unlikely and a flag may be set or message sent to the control system to notify it that the DAC is concerned about the control sequence, and is asking "are you sure?". Patterns or signatures in the data may also be learnt or estimated by applying analysis techniques such as Fourier analysis, wavelet analysis, Hadamard transform and so on, thereby enabling the DAC to adapt to use patterns.

It is this possible to provide one or more of 1) input signal checking, 2) system dynamics tuning and 3) signal transition modification as additional functionality within a DAC system without loading these tasks onto hardware outside of the boundary of the DAC. In other words these additional functions appear to be "free" to the user because they are provided as part of the DAC 50 and do not require additional hardware outside of the DAC offering to be provided.

The transition controller may have access to a sensor input so as to observe the transition that was output or the system response that occurred as a result of the transition sequence provided by the transition controller. The controller may include an update engine for comparing the observed response with a desired response and modifying the update sequence. Thus the size of the update may be modified or the time between the intermediate values being applied may be varied. This is relevant to compensating for the resonant frequency of a driven mechanical system. The update engine 20 may include a delay line such that filter functions such as FIR filters can be implemented. Alternatively one or more registers may be associated with a multiplier such that multiply and/or accumulate functions can be implemented to provide infinite impulse response filter functionality.

The DAC may therefore modify its own output transitions to mitigate some undesired performance from a signal chain downstream of the DAC.

The claims presented here are in single dependency format suitable for filing at the USPTO. However it is to be understood that each claim is capable of being dependent on any other preceding claim except where that is clearly infeasible.

What is claimed is:

1. A digital to analog converter (DAC), comprising:
   a transition controller, wherein in response to an instruction to transition from a first output value represented by a first digital word to a second output value represented by a second digital word, the transition controller inserts a sequence of intermediate steps to achieve a non-linear transition between the first output value and the second output value.

2. The DAC according to claim 1, wherein the transition controller includes a library of intermediate step functions or memory for user definable transitions.

3. The DAC according to claim 1, wherein transition controller is operable to vary an observed frequency response of the DAC.

4. The DAC according to claim 1, wherein a rate of the intermediate steps varies as the non-linear transition proceeds.

5. The DAC according to claim 1, wherein sizes of the intermediate steps vary as the non-linear transition proceeds.

6. The DAC according to claim 1, wherein the transition controller biases a shape of the transition to provide one of pre-emphasis and de-emphasis to the transition.

7. The DAC according to claim 1, further including a memory for storing a user deferred transition sequence.

8. The DAC according to claim 1, further comprising a library of controlled system responses and an update engine for fitting observed response data to a model so as to modify the response.

9. The DAC according to claim 8, wherein the observed response data is observed by monitoring perturbations at an output of the DAC or at an output buffer associated with the DAC or any downstream node.

10. The DAC according to claim 1, further comprising and in combination with an output buffer.

11. The DAC according to claim 1, further including an analysis engine for monitoring a sequence of input words supplied to the DAC and sending a warning or raising an alert if the sequence of input words indicates that the sequence of input words is wrong.

12. The DAC according to claim 11, wherein the analysis engine is responsive to user defined rules that indicate that a warning is to be sent.

13. The DAC according to claim 11 in which the analysis engine performs statistical analysis of the input sequence to determine one or more parameters of the sequence, and sends a warning or raises an alert when a parameter varies from its historical norm by a statistically significant amount.

14. The DAC according to claim 1, wherein the DAC and transition controller are provided within an operational boundary of a DAC, on a same silicon die or in a same chip scale package.

15. The DAC according to claim 1, wherein the transition controller has a time variant response.

16. A method of modifying an output response of a digital to analog converter (DAC) in response to instructions to modify an output value from a first output value corresponding to a first input word to a second output value corresponding to a second input word, wherein a transition controller included within the digital to analog converter inserts at least one intermediate step in an output sequence of the DAC.

17. The method according to claim 16, wherein the transition controller comprises a library of transition profiles, and a user selects a profile or profiles that the user wishes the transition controller to apply.

18. The method according to claim 16, wherein the transition controller varies a transition of an output of the DAC in response to an analysis of at least one of: a size of an input code change; an analysis of a frequency content in a sequence of input code changes; and
    information about a system in which the DAC is operating.

19. The method according to claim 16, wherein a size of or a position of the at least one intermediate step is selected to spread a spectral power distribution at an output of the DAC during a code transition.

20. A method of monitoring a sequence of input words provided to a digital to analog converter (DAC), the method comprising using an analysis engine provided with the DAC to monitor a sequence of input words to perform one or more of the following:
    a) building statistical knowledge of properties of the sequence of input words and to issue a warning in a statistical property of the sequence of input words varies from its historic values by a statistically significant amount, and
    b) applying one or more predetermined or user defined tests to the sequence of input words.

* * * * *